(12) United States Patent
Ottlinger et al.

(10) Patent No.: US 10,784,435 B2
(45) Date of Patent: Sep. 22, 2020

(54) METHOD FOR PRODUCING CERAMIC MULTI-LAYER COMPONENTS

(71) Applicant: Epcos AG, Munich (DE)

(72) Inventors: Marion Ottlinger, Deutschlandsberg (AT); Peter Windisch, Deutschlandsberg (AT); Robert Krumphals, Deutschlandsberg (AT); Manfred Reinisch, Gr. St. Florian (AT); Martin Galler, Karlsdorf (AT); Georg Kügerl, Eibiswald (AT)

(73) Assignee: TDK ELECTRONICS AG, Munich (DE)

( * ) Notice: Subject to any disclaimer, the term of this patent is extended or adjusted under 35 U.S.C. 154(b) by 523 days.

(21) Appl. No.: 15/500,965

(22) PCT Filed: Jul. 21, 2015

(86) PCT No.: PCT/EP2015/066655
§ 371 (c)(1),
(2) Date: Feb. 1, 2017

(87) PCT Pub. No.: WO2016/030085
PCT Pub. Date: Mar. 3, 2016

(65) Prior Publication Data
US 2017/0222120 A1 Aug. 3, 2017

(30) Foreign Application Priority Data
Aug. 26, 2014 (DE) .................... 10 2014 112 207

(51) Int. Cl.
*H01L 41/083* (2006.01)
*H01L 41/337* (2013.01)
(Continued)

(52) U.S. Cl.
CPC ...... *H01L 41/0831* (2013.01); *H01L 41/0471* (2013.01); *H01L 41/0477* (2013.01);
(Continued)

(58) Field of Classification Search
CPC ............. H01L 41/0471; H01L 41/0477; H01L 41/0831; H01L 41/0833; H01L 41/273;
(Continued)

(56) References Cited

U.S. PATENT DOCUMENTS 5,692,280 A 12/1997 Taniguchi et al.
5,786,266 A * 7/1998 Boruta ................ H01L 21/3043
125/12
(Continued)

FOREIGN PATENT DOCUMENTS

DE 10215993 A1 11/2002
DE 102004012863 A1 10/2004
(Continued)

OTHER PUBLICATIONS

International Search Report corresponding to PCT Patent Application No. PCT/EP2015/066655, European Patent Office, dated Oct. 28, 2015; (3 pages).

*Primary Examiner* — A. Dexter Tugbang
(74) *Attorney, Agent, or Firm* — Nixon Peabody LLP

(57) ABSTRACT

Methods for producing ceramic multi-layer components and multi-layer components made by such methods. A method includes the following steps: providing green layers for the ceramic multi-layer components, stacking the green layers into a stack and subsequently pressing the stack into a block, singulating the block into partial blocks each having a longitudinal direction, thermally treating the partial blocks and subsequently machining surfaces of the partial blocks. Recesses are produced on the surfaces of the partial blocks during the machining, and the partial blocks are singulated.

12 Claims, 3 Drawing Sheets

(51) Int. Cl.
  *H01L 41/273* (2013.01)
  *H01L 41/338* (2013.01)
  *H01L 41/047* (2006.01)
  *H01L 21/304* (2006.01)
  *H01G 4/30* (2006.01)

(52) U.S. Cl.
  CPC ........ *H01L 41/0833* (2013.01); *H01L 41/273* (2013.01); *H01L 41/337* (2013.01); *H01L 41/338* (2013.01); *H01G 4/304* (2013.01); *H01L 21/3043* (2013.01); *Y10T 29/42* (2015.01)

(58) Field of Classification Search
  CPC . H01L 41/337; H01L 41/338; H01L 21/3043; Y10T 29/42; H01G 4/304
  See application file for complete search history.

(56) References Cited

U.S. PATENT DOCUMENTS

| | | | | |
|---|---|---|---|---|
| 6,117,347 | A | * | 9/2000 | Ishida ................ H01L 21/3043 216/17 |
| 2002/0005680 | A1 | | 1/2002 | Kobayashi et al. |
| 2002/0157756 | A1 | | 10/2002 | Sato et al. |
| 2003/0070271 | A1 | * | 4/2003 | Yasugi ................ H01L 41/338 29/25.35 |
| 2003/0098632 | A1 | | 5/2003 | Takeuchi et al. |
| 2004/0178701 | A1 | * | 9/2004 | Sato .................... H01L 41/0833 310/328 |
| 2008/0218032 | A1 | | 9/2008 | Okamoto et al. |

FOREIGN PATENT DOCUMENTS

| | | | |
|---|---|---|---|
| DE | 102005030109 | A1 | 3/2006 |
| DE | 102008001090 | A1 | 11/2008 |
| DE | 102008049788 | A1 | 6/2010 |
| DE | 102009028259 | A1 | 2/2011 |
| DE | 102012105059 | A1 | 12/2013 |
| EP | 1811582 | | 7/2007 |
| JP | H10-290031 | A | 10/1998 |
| JP | 2001-358374 | A | 12/2001 |
| JP | 2003282988 | | 10/2003 |
| JP | 2006511951 | | 4/2006 |
| JP | 2006179715 | A | 7/2006 |
| JP | 2007134561 | A * | 5/2007 |
| JP | 2012182164 | | 9/2012 |
| WO | WO 2011/015403 | A1 | 2/2011 |

* cited by examiner

METHOD FOR PRODUCING CERAMIC MULTI-LAYER COMPONENTS

CROSS-REFERENCE TO RELATED APPLICATIONS

This application is a U.S. National Stage of International Application No. PCT/EP2015/066655, filed Jul. 21, 2015, which claims the benefit of Germany Patent Application No. 10 2014 112 207.0, filed on Aug. 26, 2014, both of which are incorporated herein by reference in their entireties.

The present invention relates to a method for producing ceramic multi-layer components and to a ceramic multi-layer component.

An object addressed is that of specifying an improved ceramic multi-layer component and also a method for the production thereof.

This object is achieved by the method having the features of patent claim 1. Furthermore, the object is achieved by a ceramic multi-layer component as per the second independent claim.

A method for producing ceramic multi-layer components is specified. The method comprises providing green layers for the ceramic multi-layer components, stacking the green layers into a stack and subsequently pressing the stack into a block, singulating the block into partial blocks each having a longitudinal direction, thermally treating the partial blocks and subsequently machining surfaces of the partial blocks, wherein recesses are produced on the surfaces of the partial blocks during the machining, and singulating the partial blocks along the recesses.

In this case, the steps can be carried out in succession in the sequence specified here. The method thus makes it possible to carry out numerous steps of the production method, before the multi-layer components, which are combined in a partial block, are singulated. The effort which is to be exerted for the production method is reduced considerably by carrying out the singulation at a late point in time in the method, since method steps in which partial blocks are treated can be carried out in a significantly easier manner than method steps in which individual multi-layer components are treated, on account of the lower number of separate parts to be treated.

The formation of the recesses in the surfaces of the partial blocks during the production method makes it possible to produce multi-layer components which are suitable owing to a particularly good utilization of installation space in the case of a circular cylindrical installation space. Multi-layer components having a shape which is well approximated to the shape of the circular cylindrical installation space are thus produced.

In particular, it is not necessary to individually modify the shape of each multi-layer component, for example by cropping the corners after the singulation. Instead, the method defined above makes it possible to adapt a multiplicity of multi-layer components to the later installation space while they are still combined in a partial block. As a result, as described above, these are considerably easier to handle than would be the case for singulated multi-layer components.

The method additionally affords further advantages. The smaller the cross section of a multi-layer component, the greater the warping that the component experiences during thermal treatment by means of sintering. The thermal treatment here is carried out on the unsingulated partial block, and therefore the warping is very minor. As a result, it is possible to avoid the excessive scrapping of warped multi-layer components and an increased outlay on grinding for compensating for the warping.

The risk of mechanical damage, for example the breaking off of edges, to the individual multi-layer components is reduced considerably, since the partial blocks are singulated only at a very late point in time in the method.

The method can be configured in such a way that the cutting faces along which the partial blocks are singulated already satisfy the requirements with respect to the surface quality of the multi-layer components. Therefore, further processing of the cutting faces is not necessary. This can relate both to the cutting faces along which the block is singulated into partial blocks and to the cutting faces along which the partial blocks are singulated into multi-layer components.

In particular, singulation can be carried out by cutting the partial block with very high precision. Accordingly, singulation by cutting makes it possible to observe very narrow tolerance limits for the dimensions of the multi-layer components. In this way, it is possible to observe process monitoring parameters, such as for example cpk values, very effectively.

The method can be carried out with little loss of material. In particular, it is not necessary to further process, for example abrade, each multi-layer component after the singulation, such that material loss does not arise here.

The method can furthermore comprise further steps, for example applying external contact-making means to the partial blocks, the external contact-making means ensuring contacting of the multi-layer components produced. In particular, the ceramic multi-layer components may be piezo-electric multi-layer components, for example piezoelectric actuators.

The surfaces may be the surfaces of the side faces of the partial block, the surface of the top side of the partial block and/or the surface of the bottom side of the partial block. In this case, the top side and bottom side may lie opposite one another in a stacking direction of the block. The side faces can furthermore be arranged in such a way that the respective face normal thereof is perpendicular to the stacking direction.

The longitudinal direction may be perpendicular to the stacking direction.

Furthermore, the partial blocks can be singulated along the recesses. In this respect, the recesses can be arranged in such a way that they co-determine the shape of the multi-layer components which are produced from the partial blocks by the singulation. In particular, the recesses can lead to a shape of the multi-layer components in which the corners of a base area are cropped. As a result, the multi-layer components can be adapted effectively to the respective installation space. By way of example, it is possible to produce multi-layer components which are adapted effectively to a circular cylindrical installation space.

Furthermore, the recesses produced during the machining can extend in a direction transverse to the longitudinal direction. This configuration of the recesses, too, can contribute to an improved adaptation of the multi-layer components to a specific installation space.

The recesses can be produced in the surfaces of the partial blocks by grinding during the machining. In particular, during the machining, the surfaces of the partial blocks can be abraded in a planar manner, and, in the same method step, the recesses can be produced in the surfaces of the partial blocks by grinding. No significant additional expenditure thus arises for producing the recesses in the surfaces.

After the thermal treatment, the green layers can form, in each partial block, ceramic layers arranged one on top of another and first and second electrically conductive layers arranged therebetween. In particular, by virtue of a sintering process, the green layers can be converted into the ceramic layers and the electrically conductive layers arranged therebetween. Furthermore, after the machining of the surfaces, the partial blocks can be selectively etched, wherein material is removed from the first electrically conductive layers on a first side face of the partial block and in the recesses produced in the first side face during the selective etching, and material is removed from the second electrically conductive layers on a second side face of the partial block and in the recesses produced in the second side face during the selective etching.

Insulation zones can be formed by said etching process. In particular, material in the respective recesses can be removed during the etching process. Accordingly, the insulation zones can also be formed in the regions of the recesses in the state of the partial block. No further processing steps are therefore required for forming the insulation zones in cropped corners after the singulation of the partial block. The etching process is effected in the recesses as well as on the side faces of the partial block.

The singulation of the partial blocks along the recesses forms sharp edges. Here, the sharp edges form at those points at which a side face which has been machined before the singulation butts against a side face which, during the singulation, represents a cutting face along which two multi-layer components have been separated. The above-described selective etching of the partial blocks before the singulation ensures that the sharp edge lies in an insulation zone. Material either of the first conductive layer or of the second conductive layer is therefore removed along the sharp edge. The sharp edges formed by the singulation are therefore switched in an electrically passive state. Since sharp edges are more susceptible to mechanical damage than is the case given rounded edges, it is advantageous if the sharp edges lie in an insulation zone. If the sharp edge is mechanically damaged, the operation of the multi-layer component is not impaired as a result if the sharp edge lies in an insulation zone.

Furthermore, the recesses can be V-shaped. The formation of V-shaped recesses in the partial blocks makes it possible to produce cylindrical multi-layer components with an octagonal base area which are effectively adapted to a circular cylindrical installation space.

The recesses can be shaped in such a manner that the edges which form are slightly rounded. In particular, in the case of V-shaped recesses, both the tip of the V and also the marginal regions in which the recesses run out can have a rounded configuration.

A further aspect of the present invention relates to a ceramic multi-layer component. This may be in particular a multi-layer component which has been produced by the above-described method. Accordingly, all of the functional and structural features disclosed in conjunction with the method can also apply to the multi-layer component. Accordingly, all of the functional and structural features disclosed in conjunction with the multi-layer component can also apply to the method.

What is proposed is a ceramic multi-layer component, which comprises a main body with ceramic layers arranged one on top of another and electrically conductive layers arranged therebetween, wherein the main body has a base area which has the form of a rectangle with cropped corners.

A multi-layer component of this type is adapted particularly effectively to a circular cylindrical installation space.

A multi-layer component of this type can be produced by the above-described method, wherein a singulation of the partial blocks into multi-layer components is carried out only at a very late point in time in the method, such that the above-described advantages arise, for example a reduced outlay for production.

The base area of the main body is preferably octagonal.

The rectangle, the shape of which is possessed by the base area, can have four side faces, wherein each of the electrically conductive layers is spaced apart from an outer side of the main body on one of the side faces and in the cropped corners adjoining the side face, and reaches as far as the outer side of the main body in the other side faces and also the remaining cropped corners.

The ceramic multi-layer component can be a piezoelectric multi-layer component, or a piezoelectric actuator.

The electrically conductive layers can comprise at least one of the materials copper, silver and silver-palladium. In particular, the electrically conductive layers can consist of one of these materials.

Further advantages, advantageous configurations and functionalities of the invention become apparent from the following description of the exemplary embodiments in conjunction with the figures.

FIG. 1 schematically shows a block of green layers provided with electrically conductive layers.

FIG. 2 schematically shows a partial block which has been singulated from the block.

The figures show a production method for ceramic multi-layer components.

Figure 1:
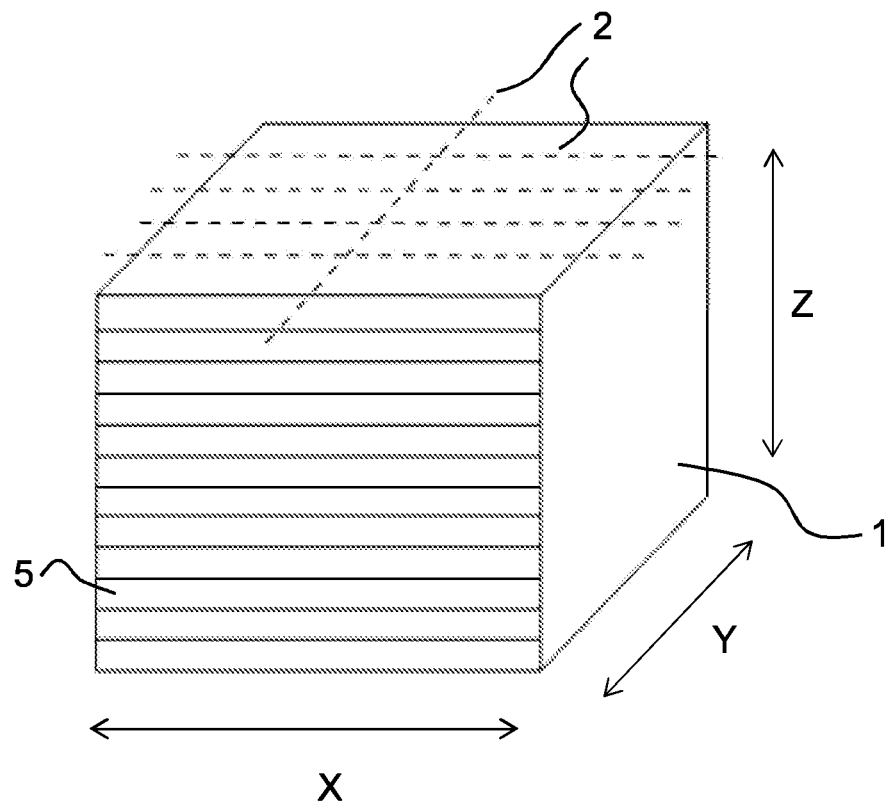

FIG. 1 shows a block 1. The block 1 has preferably been formed or produced by pressing a stack of green layers 5 layered one on top of another and provided with electrically conductive layers. The stacking direction corresponds to the direction Z in FIG. 1. To this end, the green layers 5 have preferably been provided beforehand and preferably each provided with at least one of the electrically conductive layers. The green layers 5 can be films for a ceramic or ceramic layer to be produced. The electrically conductive layers can be printed onto the ceramic films, for example by screen printing. In the finished multi-layer component, the electrically conductive layers form internal electrodes.

After the green layers 5 provided with electrically conductive layers have been stacked, at least one electrically conductive layer is preferably present between two adjacent green layers 5.

The block 1 has a longitudinal direction X. The longitudinal direction X is perpendicular to the stacking direction Z.

Figure 2:
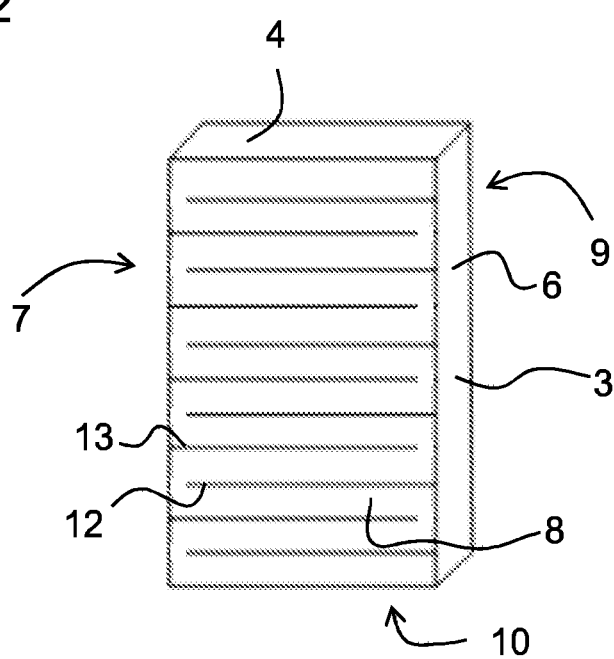

After the pressing, the block 1 is singulated into partial blocks 3. A partial block 3 of this type is shown in FIG. 2. The contours of the partial blocks 3 are denoted by cuts or cutting directions 2 in FIG. 1. The singulation preferably involves cutting of the block 1 into partial blocks 3.

The cuts 2 are made during the singulation preferably parallel and perpendicular to the longitudinal direction X. In particular, "perpendicular to the longitudinal direction X" means preferably transverse to the longitudinal direction. The direction perpendicular to the longitudinal direction is referred to as the Y direction. The block 1 is preferably cut only once perpendicular or transverse to the longitudinal direction X. Alternatively, the block 1 can be cut several times transverse to the longitudinal direction X. The number of partial blocks 3 which have been cut transverse to the longitudinal direction X can be between two and ten. It is also possible to make no cut perpendicular or transverse to the longitudinal direction X.

In the longitudinal direction X, the block 1 is preferably cut multiple times (four times in FIG. 1, for example). In this case, the cuts 2 run parallel to the longitudinal direction X. The number of partial blocks 3 which have been cut in the longitudinal direction X can be between two and 50, for example. During the singulation, the block 1 is preferably cut more often by cuts 2 in the longitudinal direction X than by cuts 2 in the Y direction. The cutting faces of the partial blocks 3 in this respect preferably already satisfy the requirements with respect to the desired surface quality, for example in relation to the roughness.

FIG. 2 shows a partial block 3 or bar as an example of a multiplicity of the partial blocks 3 singulated from the block 1.

The method presented furthermore comprises, after the singulation of the block 1 into the partial blocks 3, the thermal treatment of the partial blocks 3. The thermal treatment can comprise decarburization of the partial blocks 3 for expelling carbon from the partial blocks 3, for example in an oxygen-deficient atmosphere. The oxygen-deficient atmosphere can be an atmosphere with a reduced oxygen partial pressure. By virtue of a reduced oxygen partial pressure, it is possible to prevent or restrict in particular oxidation of the electrically conductive layers, which are formed for example from copper (Cu). Preferably after the decarburization, the thermal treatment comprises sintering of the green layers into ceramic layers.

The thermal treatment can convert the green layers into ceramic layers with electrically conductive layers 12, arranged therebetween. In particular, after the thermal treatment, each partial block 3 has alternately stacked ceramic layers and electrically conductive layers 12, 13, with first electrically conductive layers 12 and second electrically conductive layers 13 furthermore alternating in the stacking direction Z. The first electrically conductive layers 12 reach as far as a third side face 6 of the respective partial block 3 and are spaced apart from a fourth side face 7 of the respective partial block 3. Furthermore, the second electrically conductive layers 13 reach as far as a fourth side face 7 of the respective partial block 3 and are spaced apart from a third side face 6 of the respective partial block 3.

The method furthermore comprises, preferably after the thermal treatment, the machining of a top side 4 and of a bottom side 10 and/or the machining of side faces 6, 7, 8, 9 of the partial blocks 3. The face normals of the top side 4 and of the bottom side 10 of the partial blocks 3 are parallel to the stacking direction Z here. Accordingly, the top side 4 and the bottom side 10 are located opposite one another in the stacking direction Z. The side faces 6, 7, 8, 9 are those outer sides of the partial block of which the face normal is perpendicular to the stacking direction. The third and the fourth side face 6, 7 are located opposite one another in the longitudinal direction X. The first and the second side face 8, 9 are located opposite one another in the Y direction.

Figure 3:
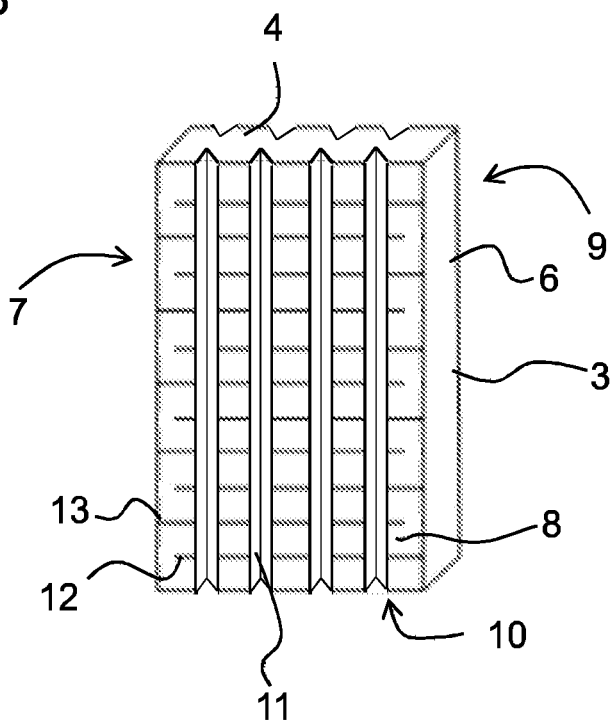
FIG. 3 shows the partial block after surfaces of the partial block have been machined.

FIG. 3 shows a partial block after the step of machining of the surfaces. The step of machining can comprise, in particular, grinding of the surfaces. The surfaces are, in particular, the surfaces of the side faces 6, 7, 8, 9. The surfaces of the side faces 6, 7, 8, 9 are abraded. In addition, recesses 11 are produced in the surfaces of the first and the second side face 8, 9. These recesses 11 extend in the stacking direction Z, i.e. perpendicular to the longitudinal direction X along the side faces 8, 9. The recesses 11 can be v-shaped.

The recesses 11 are made along the cutting lines 2, along which the partial blocks 3 are singulated in a later method step. The recesses 11 are produced by grinding. In particular, the recesses 11 can be produced in the same method step in which the surfaces of the side faces 6, 7, 8, 9 are also abraded.

Furthermore, the surfaces of the top side 4 and of the bottom side 10 can also be machined, for example by means of abrasion. Recesses 11 can also be produced on the surfaces of the top side 4 and of the bottom side 10 of the partial block 3, but these are not provided in the exemplary embodiment shown in FIG. 3. The recesses 11 on the top and bottom sides 4, 10 can extend in the Y direction, i.e. perpendicular to the longitudinal direction X and perpendicular to the stacking direction Z. The recesses 11 on the surfaces of the top side 4 and of the bottom side 10 can also be provided at those locations along which the cuts 2 for the later singulation of the partial blocks 3 run.

Profiling of the partial blocks 3 is achieved by the recesses 11.

Then, each of the individual partial blocks 3 is selectively etched. In this case, part of the electrically conductive layers 12, 13 on a respective side face 8, 9 of the partial block 3 is removed. For the selective etching, each partial block 3 is firstly provided with a first auxiliary electrode (not shown), which is connected to the first conductive layers 12, and with a second auxiliary electrode (not shown), which is connected to the second conductive layers 13. The auxiliary electrodes are applied in each case to the side faces 6, 7 located opposite one another in the longitudinal direction X.

Then, an etching medium is applied to at least part of the partial block 3. In particular, the etching medium is applied to the first side face 8 and the recesses 11 produced in the first side face 8. Then, a voltage is applied between the first and the second auxiliary electrode, as a result of which there is removal of material from at least one of the first or the second electrically conductive layer 12, 13. By way of example, the partial block 3 can be dipped partially into an etching medium in order to apply the etching medium. Then, the etching medium is applied to the second side face 9 and in the recesses 11 in the second side face 9, and a voltage of opposing polarity is applied between the first and the second auxiliary electrode, such that material of the respective other of the first or the second electrically conductive layers 12, 13 on the second side face 9 and in the recesses 11 in the second side face 9 is then removed.

Figure 4:
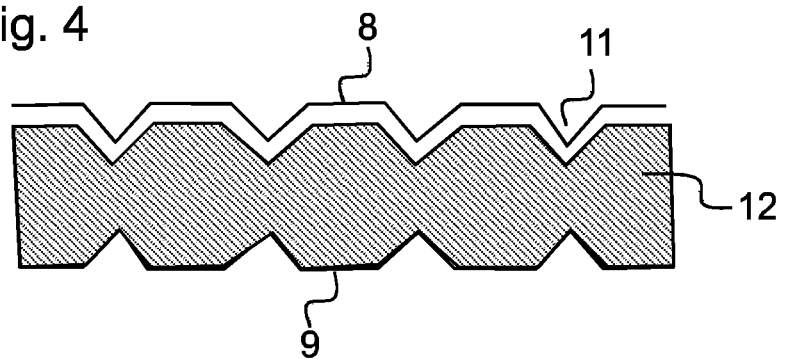
FIG. 4 shows a cross section through the partial block shown in FIG. 3.

FIG. 4 shows a cross section through a partial block 3, the cross section being made in a plane in which a first conductive layer 12 is located. The material of the first electrically conductive layer 12 has been removed on the first side face 8 and also in the recesses 11 in the first side face. Accordingly, the first electrically conductive layer 12 here does not reach as far as the first side face 8 of the partial block 3.

Figure 5:
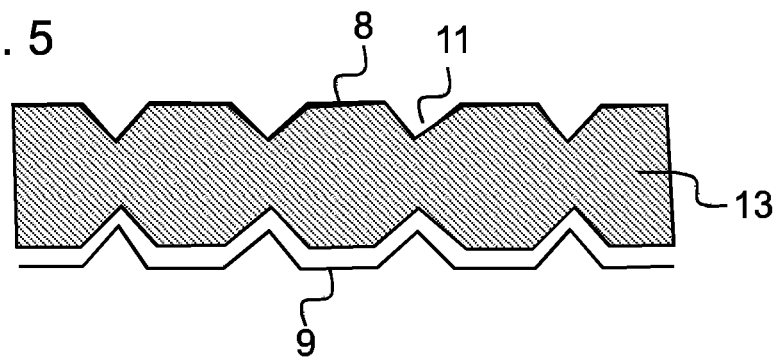
FIG. 5 shows a further cross section through the partial block shown in FIG. 3, the cross section running through a plane adjacent to the cross-sectional plane of FIG. 4.

FIG. 5 shows a cross section through a plane which is adjacent to the plane shown in FIG. 4 and in which a second electrically conductive layer 13 is located. Here, the material of the second electrically conductive layer 13 has been removed on the second side face 9 and in the recesses 11 in the second side face 9.

Figure 6:
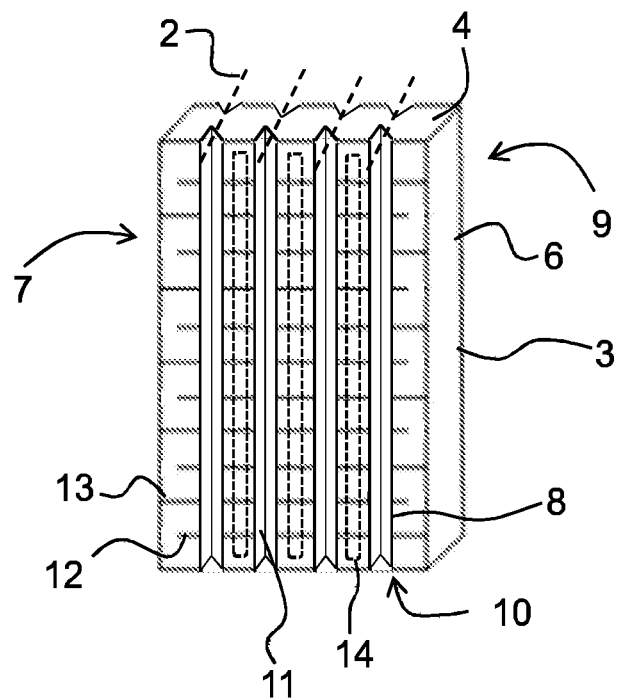
FIG. 6 shows a singulation of the partial block into multi-layer components.

FIG. 6 illustrates the singulation of the partial blocks 3 transverse to the longitudinal direction X into individual ceramic multi-layer components.

After the selective etching and before the singulation, each individual partial block 3 was provided with external electrodes 14. The external electrodes 14 are preferably fitted or deposited on the first and the second side face 8, 9 of the partial blocks 3.

As a result of the above-described selective etching, the partial blocks 3 are then configured in such a manner that, on the first side face 8, only the second electrically conductive layers 13 project as far as the first side face 8, and, on the second side face 9, only the first electrically conductive layers 12 project as far as the second side face 9. When the partial blocks 3 are provided with external electrodes 14, only every second electrically conductive layer 12, 13 is therefore contact-connected and/or electrically conductively connected to the respective external electrode 14 in each case on the side faces 8 and 9.

The partial blocks 3 are singulated along the cuts 2. The singulation is effected by cutting the partial blocks. The cutting faces in this respect preferably already satisfy the requirements with respect to the desired surface quality, for example in relation to the roughness.

Figure 7:
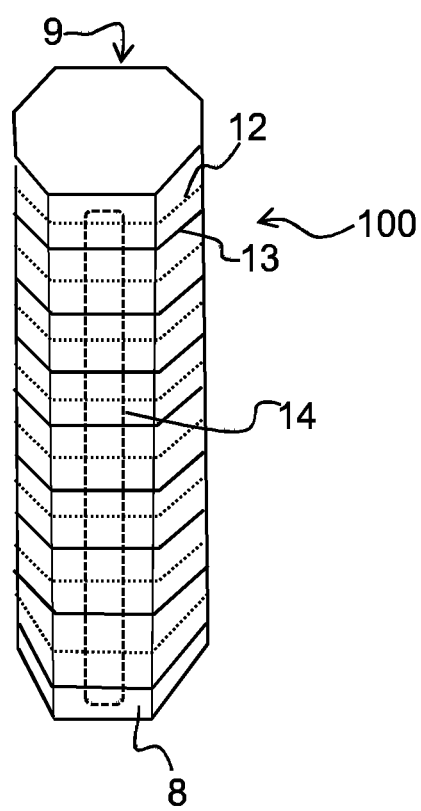
FIG. 7 shows a multi-layer component after the end of the production method, in a perspective view.

FIG. 7 shows a multi-layer component 100 which has been produced by the singulation of the partial block 3.

The singulation of the partial blocks 3 gives rise to multi-layer components 100 having a base area which has the form of a rectangle with cropped corners. The cropped corners are caused here by the recesses 11 in the partial block 3. The first conductive layers 12 reach on the second side face 9, in the cropped corners, which adjoin the second side face 9, and along the cutting faces as far as the outer side of the base area. On the first side face 8 and in the corners adjoining the first side face 8, they do not reach as far as the outer side of the base area. For this reason, in the perspective illustration of FIG. 7, the first conductive layers 12 are indicated by dotted lines.

Furthermore, the second conductive layers 13 reach on the first side face 8, in the cropped corners, which adjoin the first side face 8, and along the cutting faces 2 as far as the outer side of the base area. On the second side face 9 and in the corners adjoining the second side face 9, they do not reach as far as the outer side of the base area.

After the singulation, a thermal and/or mechanical treatment of the side faces 6, 7, 8, 9 of the ceramic multi-layer component 100 is no longer required.

After the partial blocks have been singulated into the ceramic multi-layer components 100, the method can comprise further process steps for finishing the individual ceramic multi-layer components 100.

The method presented can be employed in the production of multi-layer piezoelectric actuators having Cu internal electrodes. Furthermore, it is also possible to process or produce components or actuators having different types of electrode, e.g. of Ag or AgPd, in the same way.

This technology can also be employed for other products, e.g. for multi-layer ceramic capacitors, where the multi-layer structural parts or multi-layer components are processed by way of many process steps as part of the block or as an entire block and not in singulated form.

LIST OF REFERENCE SIGNS

1 Block
2 Cut or cutting direction
3 Partial block
4 Top side
5 Green layer
6 Third side face
7 Fourth side face
8 First side face
9 Second side face
10 Bottom side
11 Recess
12 First electrically conductive layer
13 Second electrically conductive layer
14 External electrode
100 Multi-layer component
X Longitudinal direction
Y Y direction
Z Stacking direction

The invention claimed is:

1. A method for producing ceramic multi-layer components, comprising:
    providing green layers for the ceramic multi-layer components,
    stacking the green layers into a stack and subsequently pressing the stack into a block,
    singulating the block into partial blocks each having a longitudinal direction,
    thermally treating the partial blocks and subsequent to the thermally treating, machining surfaces of the partial blocks, wherein recesses are produced on the surfaces of the partial blocks during the machining,
    singulating the partial blocks subsequent to the thermally treating.

2. The method according to claim 1,
    wherein the partial blocks are singulated along the recesses.

3. The method according to claim 2, wherein the recesses produced during the machining of the surfaces of the partial blocks extend in a direction transverse to the longitudinal direction.

4. The method according to claim 3, wherein the recesses are produced in the surfaces of the partial blocks by grinding during the machining of the surfaces of the partial blocks.

5. The method according to claim 4,
    wherein, during the machining of the partial blocks, the surfaces of the partial blocks are abraded in a planar manner, and during the machining of the surfaces of the partial blocks, the recesses are produced in the surfaces of the partial blocks by grinding.

6. The method according to claim 2, wherein the recesses are produced in the surfaces of the partial blocks by grinding during the machining of the surfaces of the partial blocks.

7. The method according to claim 1,
    wherein the recesses produced during the machining of the surfaces of the partial blocks extend in a direction transverse to the longitudinal direction.

8. The method according to claim 1,
    wherein the recesses are produced in the surfaces of the partial blocks by grinding during the machining of the surfaces of the partial blocks.

9. The method according to claim 8, wherein the recesses are V-shaped.

10. The method according to claim 1,
    wherein, during the machining of the partial blocks, the surfaces of the partial blocks are abraded in a planar manner, and during the machining of the surfaces of the partial blocks, the recesses are produced in the surfaces of the partial blocks by grinding.

11. The method according to claim 1,
wherein, after the thermally treating, the green layers form, in each of the partial blocks, ceramic layers arranged one on top of another and first and second electrically conductive layers arranged between the ceramic layers,
after the machining of the surfaces of the partial blocks, selective etching the partial blocks, and
wherein material is removed from the first electrically conductive layers on a first side face of the partial block and in those of the recesses that are produced in the first side face during the selective etching, and
wherein material is removed from the second electrically conductive layers on a second side face of the partial block and in those of the recesses that are produced in the second side face during the selective etching.

12. The method according to claim 1,
wherein the recesses are V-shaped.

\* \* \* \* \*